United States Patent
Lee et al.

(10) Patent No.: US 11,106,305 B2
(45) Date of Patent: Aug. 31, 2021

(54) DISPLAY APPARATUS HAVING TOUCH ELECTRODES

(71) Applicant: LG Display Co., Ltd., Seoul (KR)

(72) Inventors: Jae-Gyun Lee, Paju-si (KR); Ru-Da Rhe, Seoul (KR); Hyang-Myoung Gwon, Paju-si (KR); Ji-Hyun Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/922,434

(22) Filed: Jul. 7, 2020

(65) Prior Publication Data

US 2021/0026479 A1    Jan. 28, 2021

(30) Foreign Application Priority Data

Jul. 24, 2019 (KR) .......... 10-2019-0089543

(51) Int. Cl.
| | |
|---|---|
| *G06F 3/041* | (2006.01) |
| *G06F 3/044* | (2006.01) |
| *H01L 27/32* | (2006.01) |
| *H01L 51/52* | (2006.01) |

(52) U.S. Cl.
CPC .......... *G06F 3/0412* (2013.01); *G06F 3/0443* (2019.05); *G06F 3/04164* (2019.05); *H01L 27/323* (2013.01); *H01L 51/5253* (2013.01)

(58) Field of Classification Search
CPC .. G06F 3/0412; G06F 3/04164; G06F 3/0443; H01L 27/323; H01L 51/5253
USPC ................................................ 345/170–178
See application file for complete search history.

(56) References Cited

U.S. PATENT DOCUMENTS

| | | | |
|---|---|---|---|
| 9,024,913 B1 | 5/2015 | Jung et al. | |
| 9,841,835 B2 | 12/2017 | Huang et al. | |
| 2013/0176238 A1* | 7/2013 | Lo | G06F 3/041 345/173 |
| 2013/0176239 A1* | 7/2013 | Lo | G06F 3/0446 345/173 |
| 2015/0185933 A1* | 7/2015 | Zhang | G06F 3/0446 345/174 |
| 2016/0062527 A1* | 3/2016 | Lee | G06F 3/04164 345/173 |
| 2016/0252999 A1* | 9/2016 | Yang | G06F 3/0443 345/174 |

(Continued)

FOREIGN PATENT DOCUMENTS

| | | |
|---|---|---|
| CN | 106919290 A | 7/2017 |
| CN | 107463287 A | 12/2017 |

(Continued)

OTHER PUBLICATIONS

Japanese Office Action dated Jun. 17, 2021 from Japanese Application No. 2020-119704.

(Continued)

*Primary Examiner* — Tony O Davis
(74) *Attorney, Agent, or Firm* — Birch, Stewart, Kolasch & Birch, LLP

(57) ABSTRACT

A display apparatus is provided. The display apparatus includes touch electrodes on an encapsulating element. Each of the touch electrodes can be connected to a first touch line extending in a direction, and a second touch line extending in a direction opposite to the first touch line. Each of the touch electrodes can be connected to one of touch pads by one of the first touch lines. The second touch line can include an end on the encapsulating element. Thus, in the display apparatus, the reliability for the touch of a user or tool can be improved.

19 Claims, 7 Drawing Sheets

(56) References Cited

U.S. PATENT DOCUMENTS

| | | | |
|---|---|---|---|
| 2016/0291756 A1* | 10/2016 | Li | G06F 3/0412 |
| 2017/0344147 A1 | 11/2017 | Weng et al. | |
| 2017/0364194 A1* | 12/2017 | Jang | H01L 27/3262 |
| 2018/0033829 A1 | 2/2018 | Oh | |
| 2018/0033831 A1* | 2/2018 | An | H01L 27/323 |
| 2018/0088726 A1 | 3/2018 | Gwon et al. | |
| 2018/0335877 A1* | 11/2018 | Zhang | G06F 3/04164 |
| 2019/0294273 A1* | 9/2019 | Yoshida | G06F 3/0418 |
| 2020/0150847 A1* | 5/2020 | Jang | G06F 3/04164 |
| 2020/0152708 A1* | 5/2020 | Kim | H01L 27/323 |
| 2020/0293141 A1* | 9/2020 | Jang | G06F 3/0443 |
| 2020/0409485 A1* | 12/2020 | Gwon | H01L 51/5253 |

FOREIGN PATENT DOCUMENTS

| | | |
|---|---|---|
| CN | 107871760 A | 4/2018 |
| JP | 2016-126778 A | 7/2011 |
| JP | 2015-210811 A | 11/2015 |
| JP | 2016-99984 A | 5/2016 |
| JP | 2016-126751 A | 7/2016 |
| JP | 2017-223949 A | 12/2017 |
| JP | 2018-49253 A | 3/2018 |
| JP | 2018-84803 A | 5/2018 |
| JP | 2018-109963 A | 7/2018 |
| TW | 201329830 A | 7/2013 |
| TW | 201541310 A | 11/2015 |
| TW | 201816569 A | 5/2018 |
| TW | 201904053 A | 1/2019 |
| WO | WO 2019/031382 A1 | 2/2019 |

OTHER PUBLICATIONS

Office Action dated Jun. 30, 2021 by the Taiwanese Patent Office for Taiwanese Patent Application No. 109124268.

\* cited by examiner

DISPLAY APPARATUS HAVING TOUCH ELECTRODES

CROSS-REFERENCE TO RELATED APPLICATION

This application claims the priority benefit of Korean Patent Application No. 10-2019-0089543, filed in the Republic of Korea on Jul. 24, 2019, which is hereby incorporated by reference for all purposes as if fully set forth herein into the present application.

BACKGROUND OF THE INVENTION

Field of the Invention

The present invention relates to a display apparatus in which touch electrodes are disposed on an encapsulating element covering a light-emitting device.

Discussion of the Related Art

Generally, an electronic appliance, such as a monitor, a TV, a laptop computer and a digital camera, includes a display apparatus to realize an image. For example, the display apparatus can include at least one light-emitting device. The light-emitting device can emit light displaying a specific color. For example, the light-emitting device can include a light-emitting layer between a first electrode and a second electrode.

The display apparatus can detect a touch of a user and/or tool, to run a regular program or to input a specific signal. For example, the display apparatus can include touch electrodes. The touch electrodes can be disposed on an encapsulating layer covering the light-emitting device. Each of the touch electrodes can be connected to the corresponding touch pad by one of touch lines which extend along a surface of the encapsulating element. The touch pads can be disposed outside the encapsulating element.

However, in the display apparatus, each of the touch lines can have a different length according to the location of the corresponding touch electrode. A parasitic capacitance due to each touch line can be proportional to a length of the corresponding touch line. That is, in the display apparatus, each of the touch electrodes can have a parasitic capacitance different from each other. The parasitic capacitance of each touch electrode can affect the touch sensitivity of the corresponding touch electrode. Thus, in the display apparatus, the reliability for the touch of the user and/or tool can be decreased.

SUMMARY OF THE INVENTION

Accordingly, the present invention is directed to a display apparatus that substantially obviates one or more problems due to limitations and disadvantages of the related art.

An object of the present invention is to provide a display apparatus capable of improving the reliability for the touch of the user and/or tool.

Another object of the present invention is to provide a display apparatus capable of preventing the difference of a parasitic capacitance according to the location of touch electrodes.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising a device substrate according to an embodiment of the present invention. At least one light-emitting device, an encapsulating element and first touch pads are disposed on the device substrate. The encapsulating element covers the light-emitting device. The first touch pads are spaced away from the encapsulating element. Touch electrodes are disposed on the encapsulating element. Each of the touch electrodes is connected to a first touch line and a second touch line. The first touch line connects each touch electrode to one of the first touch pads. The first touch line extends in a first direction. The second touch line extends in a direction opposite to the first touch line with respect to the corresponding touch electrode.

The sum of a distance of the first touch line and a distance of the second touch line which are connected to the same touch electrode can be constant.

The second touch lines can include the same material as the first touch lines.

The first touch lines can include the same material as the touch electrodes.

The first touch lines and the second touch lines can be disposed on the same layer as the touch electrodes.

Each of the first touch lines and each of the second touch lines can be in contact with a side surface of the corresponding touch electrode which extends in the first direction.

At least one display pad can be disposed on the device substrate. The display pad can be connected to the light-emitting device. The display pad can be disposed side by side with the first touch lines in a second direction perpendicular to the first direction.

The display pad can include a material different from the first touch lines.

Each of touch electrodes can be connected to one of second touch pads by one of the second touch lines. The second touch pads can be disposed on the encapsulating element.

The second touch pads can include the same material as the second touch lines.

The second touch lines and the second touch pads can be covered by a touch passivation layer.

The touch passivation layer can include touch pad holes exposing a portion of each second touch pad.

In another embodiment, the display apparatus includes a device substrate. The device substrate includes a display area between a first pad area and an auxiliary area. At least one light-emitting device is disposed on the display area of the device substrate. The light-emitting device is covered by an encapsulating element. The encapsulating element extends beyond the display area. Touch electrodes are disposed on the encapsulating element. The touch electrodes overlap the display area. Each of the touch electrodes is connected to a first touch line and a second touch line. The first touch line connects the corresponding touch electrode to one of touch pads which are disposed in the first pad area. The second touch line includes an end which is disposed in the auxiliary area. The first pad area is disposed outside the encapsulating element. The auxiliary area overlaps the encapsulating element.

The device substrate can further include a second pad area. At least one display pad can be disposed in the second pad area. The display pad can be connected to the light-emitting device. The second pad area can be disposed outside the encapsulating element.

The auxiliary area can be disposed between the display area and the second pad area.

The first touch lines can include a material different from the touch electrodes.

The second touch lines can include the same material as the first touch lines.

The touch electrodes can be disposed on a touch insulating layer. The touch insulating layer can cover the first touch lines and the second touch lines.

The touch insulating layer can include touch penetrating holes. Each of the touch penetrating holes can overlap one of the touch electrodes.

Each of the second touch lines can be in contact with the corresponding touch line.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
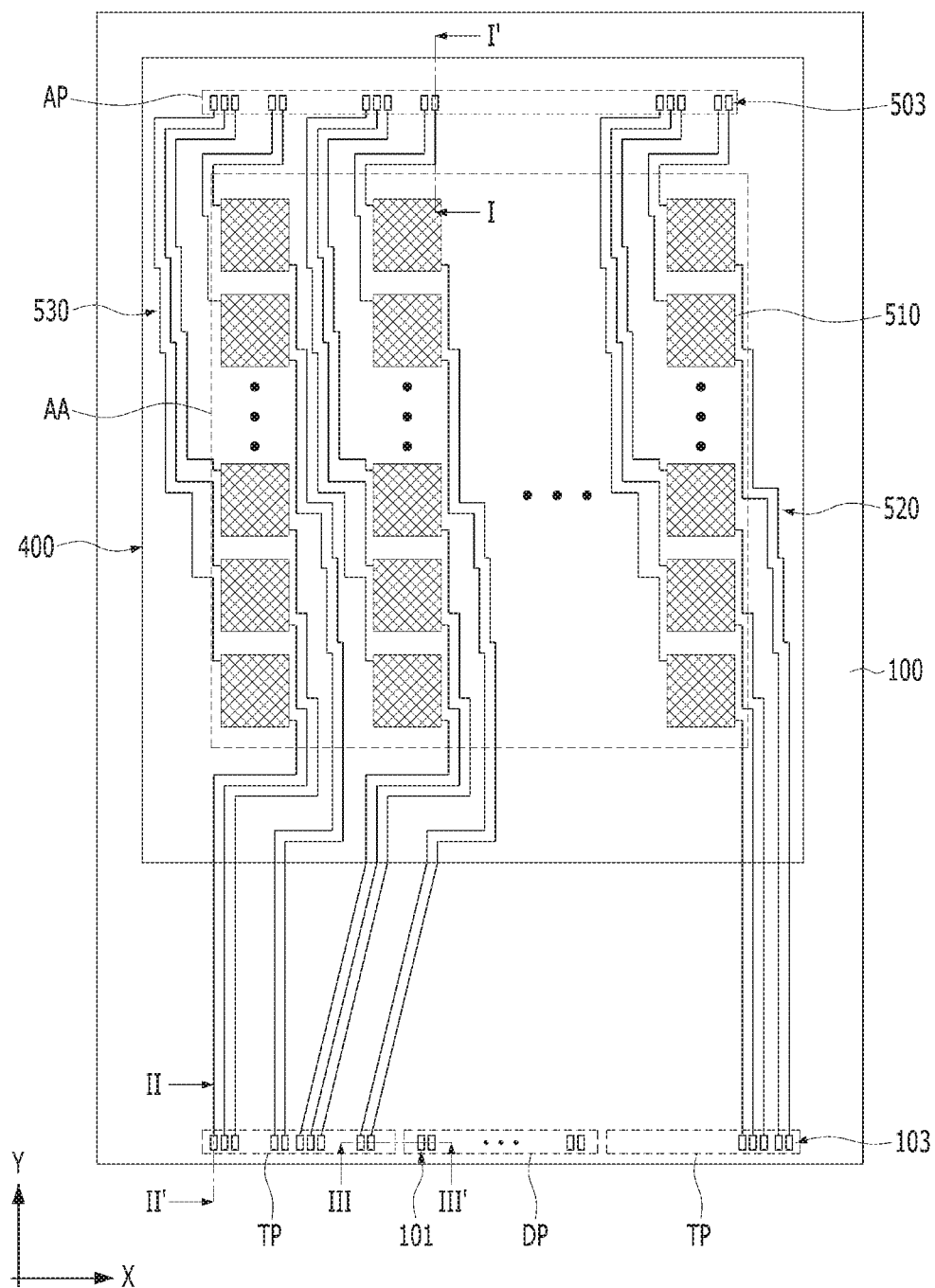
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element and may not define any order. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENTS

Figure 2A:
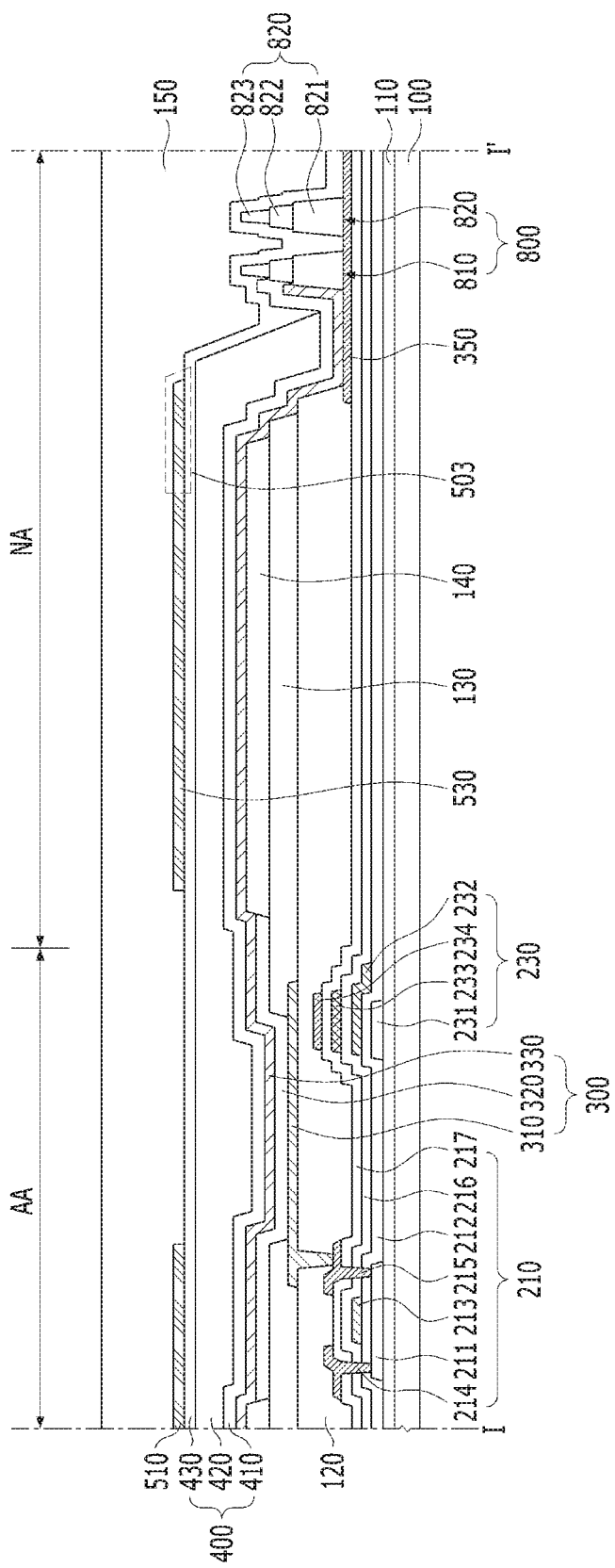
FIG. 2A is a view taken along I-I' of FIG. 1.
Figure 2B:
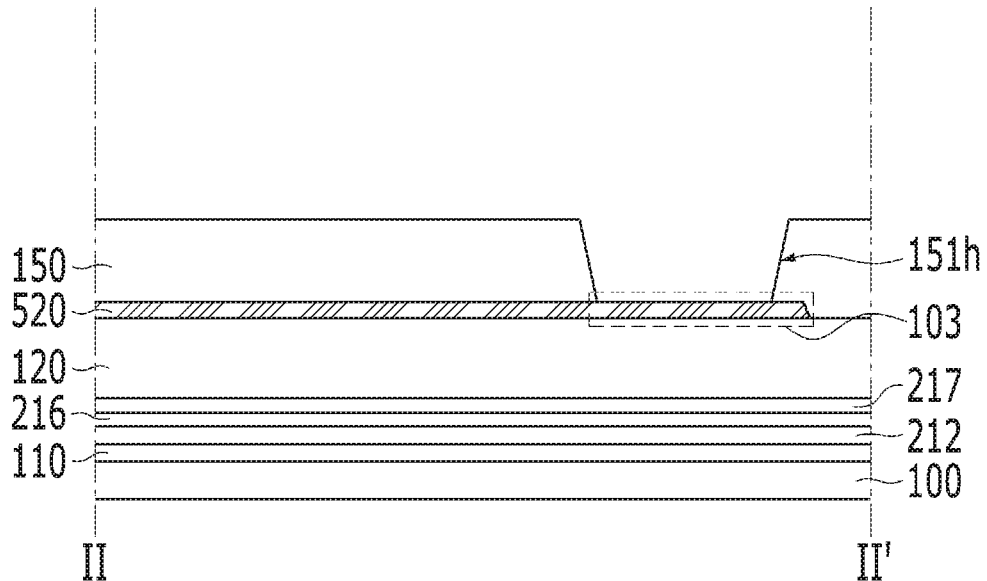
FIG. 2B is a view taken along II-II' of FIG. 1.
Figure 2C:
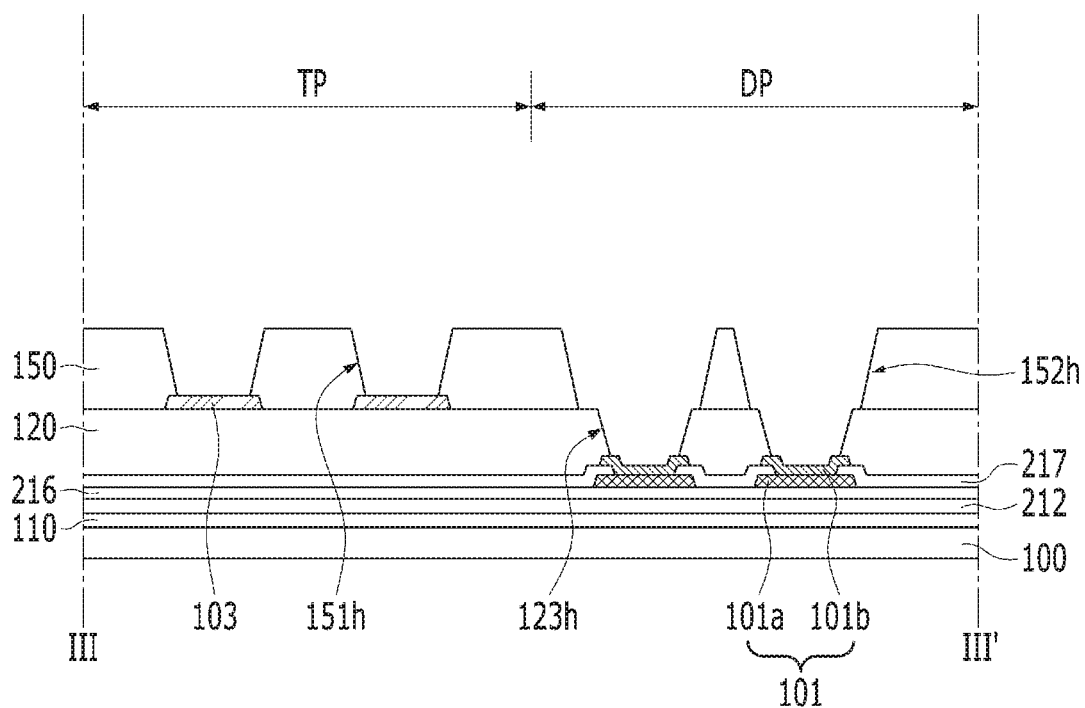
FIG. 2C is a view taken along III-III' of FIG. 1.

FIG. 1 is a view schematically showing a display apparatus according to an embodiment of the present invention. FIG. 2A is a view taken along I-I' of FIG. 1. FIG. 2B is a view taken along II-II' of FIG. 1. FIG. 2C is a view taken along III-III' of FIG. 1. All the components of the display apparatus according to all embodiments of the present invention are operatively coupled and configured.

Referring to FIGS. 1 and 2A to 2C, the display apparatus according to the embodiment of the present invention can include a device substrate 100. The device substrate 100 can include an insulating material. For example, the device substrate 100 can include glass or plastic.

The device substrate 100 can include a display area AA and a bezel area NA. The bezel area NA can be disposed outside the display area AA. For example, the display area AA can be surrounded by the bezel area NA.

At least one light-emitting device 300 can be disposed on the display area AA of the device substrate 100. The light-emitting device 300 can emit light displaying a specific color. For example, the light-emitting device 300 can include a first electrode 310, a light-emitting layer 320 and a second electrode 330, which are sequentially stacked.

The first electrode 310 can include a conductive material. The first electrode 310 can have a relative high reflectance. The first electrode 310 can have a multi-layer structure. For example, the first electrode 310 can have a structure in which a reflective electrode formed of a metal such as aluminum (Al) and silver (Ag) is disposed between transparent electrodes formed of transparent conductive material, such as ITO and IZO.

The light-emitting layer 320 can generate light having luminance corresponding to a voltage difference between the first electrode 310 and the second electrode 330. For example, the light-emitting layer 320 can include an emission material layer (EML) having an emission material. The emission material can include an organic material. For example, the display apparatus according to the embodiment of the present invention can be an organic light-emitting display apparatus having the light-emitting layer 320 formed of an organic material.

The light-emitting layer 320 can have a multi-layer structure. For example, the light-emitting layer 320 can further include at least one of a hole injection layer (HIL), a hole transporting layer (HTL), an electron transporting layer (ETL), and an electron injection layer (EIL).

The second electrode 330 can include a conductive material. The second electrode 330 can include a material different from the first electrode 310. For example, the second electrode 330 can be a transparent electrode formed of a transparent conductive material, such as ITO and IZO. Thus, in the display apparatus according to the embodiment of the present invention, the light generated from each light-emitting layer 320 can be emitted to outside through the second electrode 330.

A driving circuit can be disposed between the device substrate 100 and the light-emitting device 300. The driving circuit can apply driving current according to a gate signal and a data signal to the light-emitting device 300. For example, the driving circuit can include at least one thin film transistor 210 and a storage capacitor 230.

The thin film transistor 210 can generate the driving current by the gate signal and the data signal. For example, the thin film transistor 210 can include a semiconductor pattern 211, a gate insulating layer 212, a gate electrode 213, a source electrode 214, a drain electrode 215, a first interlayer insulating layer 216, and a second interlayer insulating layer 217.

The semiconductor pattern 211 can be disposed close to the device substrate 100. The semiconductor pattern 211 can include a semiconductor material. For example, the semiconductor pattern 211 can include amorphous silicon or poly-silicon. The semiconductor pattern 211 can be an oxide semiconductor. For example, the semiconductor pattern 211 can include IGZO.

The semiconductor pattern 211 can include a channel region between a source region and a drain region. The source region and the drain region can have a resistance lower than the channel region. For example, the channel region can have an impurity concentration lower than the source region and the drain region.

The gate insulating layer 212 can be disposed on the semiconductor pattern 211. The gate insulating layer 212 can extend beyond the semiconductor pattern 211. For example, a side surface of the semiconductor pattern 211 can be covered by the gate insulating layer 212. The gate insulating layer 212 can include an insulating material. For example, the gate insulating layer 212 can include silicon oxide (SiO) and/or silicon nitride (SiN). The gate insulating layer 212 can include a high-K material. For example, the gate insulating layer 212 can include titanium oxide (TiO). The gate insulating layer 212 can have a multi-layer structure.

The gate electrode 213 can be disposed on the gate insulating layer 212. The gate electrode 213 can overlap the channel region of the semiconductor pattern 211. The gate electrode 213 can be insulated from the semiconductor pattern 211 by the gate insulating layer 212. The gate electrode 213 can include a conductive material. For example, the gate electrode 213 can include a metal, such as aluminum (Al), chrome (Cr), copper (Cu), Titanium (Ti), molybdenum (Mo) and tungsten (W).

The source electrode 214 can be electrically connected to the source region of the semiconductor pattern 211. The drain electrode 215 can be electrically connected to the drain region of the semiconductor pattern 211. The source electrode 214 and the drain electrode 215 can be insulated from the gate electrode 213 by the first interlayer insulating layer 216 and the second interlayer insulating layer 217. For example, the first interlayer insulating layer 216 and the second interlayer insulating layer 217 can be sequentially stacked on the gate electrode 213, and the source electrode 216 and the drain electrode 217 can be disposed on the second interlayer insulating layer 217. The first interlayer insulating layer 216 and the second interlayer insulating layer 217 can include a source contact hole exposing the source region of the semiconductor pattern 211, and a drain contact hole exposing the drain region of the semiconductor pattern 211.

The first interlayer insulating layer 216 and the second interlayer insulating layer 217 can include an insulating material. For example, the first interlayer insulating layer 216 and the second interlayer insulating layer 217 can include silicon oxide (SiO) or silicon nitride (SiN). The second interlayer insulating layer 217 can include a material different from the first interlayer insulating layer 216. For example, the first interlayer insulating layer 216 can include silicon oxide (SiO), and the second interlayer insulating layer 217 can include silicon nitride (SiN).

The source electrode 214 can be electrically connected to the semiconductor pattern 211 through the source contact hole. For example, the source electrode 214 can include a portion overlapping with the source region of the semiconductor pattern 211. The drain electrode 215 can be electrically connected to the drain region of the semiconductor pattern 211 through the drain contact hole. For example, the drain electrode 215 can include a portion overlapping with the drain region of the semiconductor pattern 211. The drain electrode 215 can be spaced away from the source electrode 214.

The source electrode 214 and the drain electrode 215 can include a conductive material. For example, the source electrode 214 and the drain electrode 215 can include a metal, such as aluminum (Al), chrome (Cr), copper (Cu), Titanium (Ti), molybdenum (Mo) and tungsten (W). The drain electrode 215 can include the same material as the source electrode 214. The source electrode 214 and the drain electrode 215 can include a material different from the gate electrode 213.

The storage capacitor 230 can maintain the operation of the thin film transistor 210 for one frame. The storage capacitor 230 can include at least two conductive layers 231, 232, 233 and 234. For example, the storage capacitor 230 can include a first storage electrode 231, a second storage electrode 232, a third storage electrode 233 and a fourth storage electrode 234, which are sequentially stacked.

The storage capacitor 230 can be formed with the thin film transistor 210, simultaneously. For example, the first storage electrode 231 can be disposed on the same layer as the semiconductor pattern 211. The second storage electrode 232 can be disposed on the same layer as the gate electrode 213. For example, the second storage electrode 232 can be disposed on the gate insulating layer 212. The third storage electrode 233 can be disposed between the first interlayer insulating layer 216 and the second interlayer insulating layer 217. The fourth storage electrode 234 can be disposed on the second interlayer insulating layer 217. For example, the fourth storage electrode 234 can be disposed on the same layer as the source electrode 214 and the drain electrode 215.

The first storage electrode 231 can include the same material as the semiconductor pattern 211. The second storage electrode 232, the third storage electrode 233 and the fourth storage electrode 234 can include a conductive material. For example, the second storage electrode 232, the third storage electrode 233 and the fourth storage electrode 234 can include a metal, such as aluminum (Al), chrome (Cr), copper (Cu), Titanium (Ti), molybdenum (Mo) and tungsten (W). The second storage electrode 232 can include the same material as the gate electrode 213. The fourth storage electrode 234 can include the same material as the source electrode 214 and the drain electrode 215. The third storage electrode 233 can include a material different from the fourth storage electrode 234.

A buffer layer 110 can be disposed between the device substrate 100 and the driving circuit. The buffer layer 110 can prevent pollution from the device substrate 100 during the process of forming the driving circuit. The buffer layer 110 can extend outward of the driving circuit. For example, the buffer layer 110 can extend onto the bezel area NA. The gate insulating layer 212, the first interlayer insulating layer 216 and the second interlayer insulating layer 217 can extend along the buffer layer 110. For example, the buffer layer 110, the gate insulating layer 212, the first interlayer insulating layer 216 and the second interlayer insulating layer 217 can be sequentially stacked on the bezel area NA of the device substrate 100.

The buffer layer 110 can include an insulating material. For example, the buffer layer 110 can include silicon oxide (SiO) and/or silicon nitride (SiN). The buffer layer 110 can have a multi-layer structure. For example, the buffer layer 110 can have a stacked structure of a layer formed of silicon oxide (SiO), and a layer formed of silicon nitride (SiN).

An over-coat layer 120 can be disposed between the driving circuit and the light-emitting device 300. The over-coat layer 120 can remove a thickness difference due to the driving circuit. For example, a surface of the over-coat layer 120 toward the light-emitting device 300 can be a flat surface. The over-coat layer 120 can include an insulating material. For example, the over-coat layer 120 can include an organic insulating material. The over-coat layer 120 can include an electrode contact hole exposing a portion of the thin film transistor 210. For example, the over-coat layer 120 can expose a portion of the drain electrode 215. The light-emitting device 300 can be electrically connected to the thin film transistor 210 through the electrode contact hole. For example, the first electrode 310 can be in direct contact with the drain electrode 215 in the electrode contact hole.

A bank insulating layer 130 can be disposed on the over-coat layer 120. The operation of the light-emitting device 300 can be independently controlled by the bank insulating layer 130. For example, the bank insulating layer 130 can cover an edge of the first electrode 310. The bank insulating layer 130 can include an insulating material. For example, the bank insulating layer 130 can include an organic insulating material. The bank insulating layer 130 can include a material different from the over-coat layer 120. The light-emitting layer 320 and the second electrode 330 can be sequentially stacked on a portion of the first electrode 310 exposed by the bank insulating layer 130.

The light-emitting layer 320 can include an end on the bank insulating layer 130. For example, the light-emitting layer 320 can be formed using a fine metal mask (FMM). A spacer 140 can be disposed on the bank insulating layer 130. The spacer 140 can prevent the damage of the bank insulating layer 130 due to the fine metal mask during the process of forming the light-emitting layer 320. The second electrode 330 can extend onto the bank insulating layer 130 and the spacer 140. The second electrode 330 can extend onto the bezel area NA. A side surface of the over-coat layer 120, a side surface of the bank insulating layer 130 and a side surface of the spacer 140 can be covered by the second electrode 330 on the bezel area NA. Thus, in the display apparatus according to the embodiment of the present invention, the permeation of external moisture through the over-coat layer 120, the bank insulating layer 130 and/or the spacer 140 can be prevented.

A common voltage supply line 350 can be disposed on the bezel area NA of the device substrate 100. The common voltage supply line 350 can be connected to the second electrode 330. For example, the second electrode 330 can be in direct contact with the common voltage supply line 350 at the outside of the over-coat layer 120. The common voltage supply line 350 can include a conductive material. The common voltage supply line 350 can have the conductivity higher than the second electrode 330. For example, the common voltage supply line 350 can include a metal, such as aluminum (Al), chrome (Cr), copper (Cu), Titanium (Ti), molybdenum (Mo) and tungsten (W). Thus, in the display apparatus according to the embodiment of the present invention, the luminance variation due to the resistance of the second electrode 330 can be prevented by the common voltage supply line 350.

The common voltage supply line 350 can be disposed on the second interlayer insulating layer 217. The over-coat layer 120 can cover an end of the common voltage supply line 350. For example, the common voltage supply line 350 can include the same material as the source electrode 214 and the drain electrode 215.

An encapsulating element 400 can be disposed on the light-emitting device 300, the bank insulating layer 130 and the spacer 140. The encapsulating element 400 can prevent the damage of the light-emitting devices 300 due to the external impact and moisture. The encapsulating element 400 can have a multi-layer structure. For example, the encapsulating element 400 can include a first encapsulating layer 410, a second encapsulating layer 420 and a third encapsulating layer 430, which are sequentially stacked. The first encapsulating layer 410, the second encapsulating layer 420 and the third encapsulating layer 430 can include an insulating material. The second encapsulating layer 420 can include a material different from the first encapsulating layer 410 and the third encapsulating layer 430. For example, the first encapsulating layer 410 and the third encapsulating layer 430 can include an inorganic insulating material, and the second encapsulating layer 420 can include an organic insulating material. Thus, in the display apparatus according to the embodiment of the present invention, the thickness difference due to the light-emitting device 300, the bank insulating layer 130 and the spacer 140 can be removed by the encapsulating element 400.

The encapsulating element 400 can extend beyond the display area AA. For example, the encapsulating element 400 can include a portion overlapping with the bezel area NA of the device substrate 100. At least one dam 800 can be disposed on the common voltage supply line 350. For example, a first dam 810 and a second dam 820 can be disposed side by side on a surface of the common voltage supply line 350 opposite to the device substrate 100. The second electrode 330 can be connected to the common voltage supply line 350 between the over-coat layer 120 and the first dam 810. The dam 800 can control the flow of the encapsulating element 400. For example, the second encapsulating layer 420 formed of an organic material can include a side surface between the over-coat layer 120 and the first dam 810. The first dam 810 and the second dam 820 can be covered by the third encapsulating layer 430 formed of an inorganic material.

The first dam 810 and the second dam 820 can include an insulating material. The first dam 810 and the second dam 820 can have a multi-layer structure. For example, the second dam 820 can include a first dam pattern 821, a second dam pattern 822 and a third dam pattern 823, which are sequentially stacked. Each of the first dam pattern 821, the second dam pattern 822 and the third dam pattern 823 can be simultaneously formed with one of insulating layers between the device substrate 100 and the encapsulating element 400. For example, the first dam pattern 821 can include the same material as the over-coat layer 120, the second dam pattern 822 can include the same material as the bank insulating layer 130, and the third dam pattern 823 can include the same material as the spacer 140. The first dam 810 can have the same structure as the second dam 820.

Touch electrodes 510 can be disposed on the encapsulating element 400. The touch electrodes 510 can detect the touch of the user and/or tool. The touch electrodes 510 can be disposed in the display area AA. For example, the touch electrodes 510 can be arranged in a matrix form on the display area AA. The touch electrodes 510 can include a conductive material. For example, the touch electrodes 510 can include a metal, such as aluminum (Al), chrome (Cr), copper (Cu), Titanium (Ti), molybdenum (Mo) and tungsten (W). The touch electrode 510 may not overlap with the light-emitting device 300. For example, the touch electrodes 510 can overlap the bank insulating layer 130.

Each of the touch electrodes 510 can be connected to a first touch line 520 and a second touch line 530. Each of the first touch lines 520 can connect the corresponding touch electrode 510 to one of first touch pads 103 which are disposed in a first pad area TP. The first pad area TP can be disposed in the bezel area NA. For example, the first pad area TP can be disposed outside the encapsulating element 400. The first touch lines 520 can extend along a surface of the encapsulating element 400. The first pad area TP can be disposed side by side with the display area AA in a first direction Y. For example, the first touch lines 520 can extend in the first direction Y. The first touch pads 103 can be disposed side by side in a second direction X perpendicular to the first direction Y. For example, the first pad area TP can extend in the second direction X. A distance between each first touch pad 103 and the display area AA can be constant.

The first touch lines 520 can include a conductive material. For example, the first touch lines 520 can include a metal, such as aluminum (Al), chrome (Cr), copper (Cu), Titanium (Ti), molybdenum (Mo) and tungsten (W). The first touch lines 520 can include the same material as the touch electrodes 510. For example, each of the first touch lines 520 can be in direct contact with the corresponding touch electrode 510. The first touch lines 520 can extend between the touch electrodes 510. For example, each of the first touch line 520 can be in contact with a side surface of the corresponding touch electrode 510 which extends in the first direction Y. That is, the display apparatus according to the embodiment of the present invention can include a self-capacitance type touch structure. The first touch lines 520 can be disposed on the same layer as the touch electrodes 510. For example, the touch electrodes 510 and the first touch lines 520 can be in direct contact with the encapsulating element 400.

A second pad area DP can be disposed on the bezel area NA. The second pad area DP can be disposed side by side with the first pad area TP in the second direction X. For example, two first pad areas TP can be disposed side by side on the bezel area NA in the second direction X, and the second pad area DP can be disposed between two first pad areas TP. At least one display pad 101 can be disposed in the second pad area DP. The display pad 101 can be electrically connected to the light-emitting device 300. For example, the display pad 101 can be electrically connected to a data line applying the data signal to the thin film transistor 210.

The display pad 101 can have a multi-layer structure. For example, the display pad 101 can include a first pad layer 101a and a second pad layer 101b, which are sequentially stacked. The first pad layer 101a can be disposed between the first interlayer insulating layer 216 and the second interlayer insulating layer 217. For example, the first pad layer 101a can include the same material as the third storage electrode 233. The second pad layer 101b can be disposed on the second interlayer insulating layer 217. For example, the second pad layer 101b can include the same material as the source electrode 214 and the drain electrode 215. The second interlayer insulating layer 217 can include a pad connecting hole exposing a portion of the first pad layer 101a. The second pad layer 101b can be connected to the first pad layer 101a through the pad connecting hole. The first pad layer 101a and/or the second pad layer 101b can extend in the inner direction of the display area AA.

The first touch pads 103 can be disposed on a layer different from the display pad 101. For example, the first touch pads 103 can be disposed on the over-coat layer 120. The over-coat layer 120 can include at least one display pad contact hole 123h exposing a portion of the display pad 101. The first touch pads 103 can include the same material as the first touch lines 520. For example, each of the first touch pads 103 can be in direct contact with the corresponding first touch line 520. The first touch pads 103 can include a material different from the first pad layer 101a and the second pad layer 101b.

Each of the second touch lines 530 can connect the corresponding touch electrode 510 to one of second touch pads 503 which are disposed in the auxiliary area AP. The auxiliary area AP can be disposed in the bezel area NA. The auxiliary area AP can overlap the encapsulating element 400. For example, the second touch pads 503 can be disposed only on the encapsulating element 400. The second touch lines 530 can be disposed only on the encapsulating element 400. Thus, in the display apparatus according to the embodiment of the present invention, the size of the bezel area NA which is increased by the second touch lines 530 and the second touch pads 503 can be minimized.

The auxiliary area AP can be disposed side by side with the display area AA in the first direction Y. For example, the display area AA can be disposed between the first pad area TP and the auxiliary area AP in the first direction Y. The second touch lines 530 can extend in the first direction Y. For example, each of the second touch line 530 can extend in a direction opposite to the corresponding first touch line 520 with respect to the corresponding touch electrode 510. The second touch pads 503 can be disposed side by side in the second direction X. For example, the auxiliary area AP can extend in the second direction X. A distance between each second touch pad 503 and the display area AA can be constant.

Each of the touch electrodes 510 can have a parasitic capacitance by the corresponding first touch line 520, and a parasitic capacitance by the corresponding second touch line 530. The distance between the first pad area TP and the auxiliary area AP in the first direction Y can be constant. Thus, in the display apparatus according to the embodiment of the present invention, the touch electrode 510 spaced relatively far from the first pad area TP in the first direction Y can be disposed relatively close to the auxiliary area AP in the first direction Y. That is, in the display apparatus according to the embodiment of the present invention, the length of each second touch line 530 can be inversely proportional to the length of the first touch line 520 which is connected to the corresponding touch electrode 510. For example, in the display apparatus according to the embodiment of the present invention, the sum of the length of the first touch line 520 and the length of the second touch line 530 which are connected to the same touch electrode 510 can be the same value. Thus, in the display apparatus according to the embodiment of the present invention, the parasitic capacitance of each touch electrode 510 by the corresponding first touch line 520 and the corresponding second touch line 530 can be the same value.

The second touch lines 530 can include a conductive material. For example, the second touch liens 530 can include a metal, such as aluminum (Al), chrome (Cr), copper (Cu), Titanium (Ti), molybdenum (Mo) and tungsten (W). The second touch lines 530 can include the same material as the first touch lines 520. For example, each of the second touch lines 530 can be in direct contact with the corresponding touch electrode 510. The second touch lines 530 can extend between the touch electrodes 510. For example, each of the second touch lines 530 can be in contact with a side surface of the corresponding touch electrode 510 which extends in the first direction Y. The side surface of each touch electrode 510 being in contact with the corresponding second touch line 530 can be opposite to the side surface of the corresponding touch electrode being in contact with the corresponding first touch line 520. For example, each of the touch electrodes 510 can be disposed between the corresponding first touch line 520 and the corresponding second touch line 530. The second touch lines 530 can be disposed on the same layer as the first touch lines 520. For example, the second touch lines 530 can be in direct contact with the encapsulating element 400.

The second touch pads 503 can include the same material as the second touch lines 530. For example, each of the second touch pads 503 can be in direct contact with the corresponding second touch line 530. The second touch pads 503 can be in direct contact with the encapsulating element 400.

A touch passivation layer 150 can be disposed on the touch electrode 510, the first touch lines 520 and the second touch lines 530. The touch passivation layer 150 can prevent the damage of the touch electrodes 510, the first touch lines 520 and the second touch lines 530 due to the external impact and moisture. The touch passivation layer can include an insulating material.

The touch passivation layer 150 can include first pad holes 151h exposing a portion of each first touch pad 103, and second pad holes 152h overlapping with the display pad contact holes 123h. The second touch pads 503 can be covered by the touch passivation layer 150, completely. For example, in the display apparatus according to the embodiment of the present invention, the second touch pads 503 can be used in a non-contact type test process. That is, in the display apparatus according to the embodiment of the present invention, signals for defective inspection of the touch electrodes 510 can be applied in both directions. Thus, in the display apparatus according to the embodiment of the present invention, the inspection process for the touch electrodes 510 can be performed, rapidly. And, in the display apparatus according to the embodiment of the present invention, the defect inspection for the first touch lines 520 can be simultaneously performed with the defect inspection for the touch electrodes 510. Therefore, in the display apparatus according to the embodiment of the present invention, the efficiency of the inspection process can be improved.

Accordingly, in the display apparatus according to the embodiment of the present invention, the touch electrodes 510 on the encapsulating element 400 can be disposed between the first touch pads 103 and the second touch pads 503, each of the touch electrodes 510 can be connected to one of the first touch pads 103 by the corresponding first touch line 520, and each of the touch electrodes 510 can be connected to one of the second touch pads 503 by the corresponding second touch line 530. Thus, in the display apparatus according to the embodiment of the present invention, the difference of the parasitic capacitance due to the location of the touch electrodes 510 can be prevented. Thereby, in the display apparatus according to the embodiment of the present invention, the reliability for the touch of the user and/or tool can be improved.

The display apparatus according to the embodiment of the present invention is described that the second touch pads 503 can be covered by the touch passivation layer 150, completely. However, in the display apparatus according to another embodiment of the present invention, the touch passivation layer 150 can expose a portion of each second touch pad 503.

Figure 3:
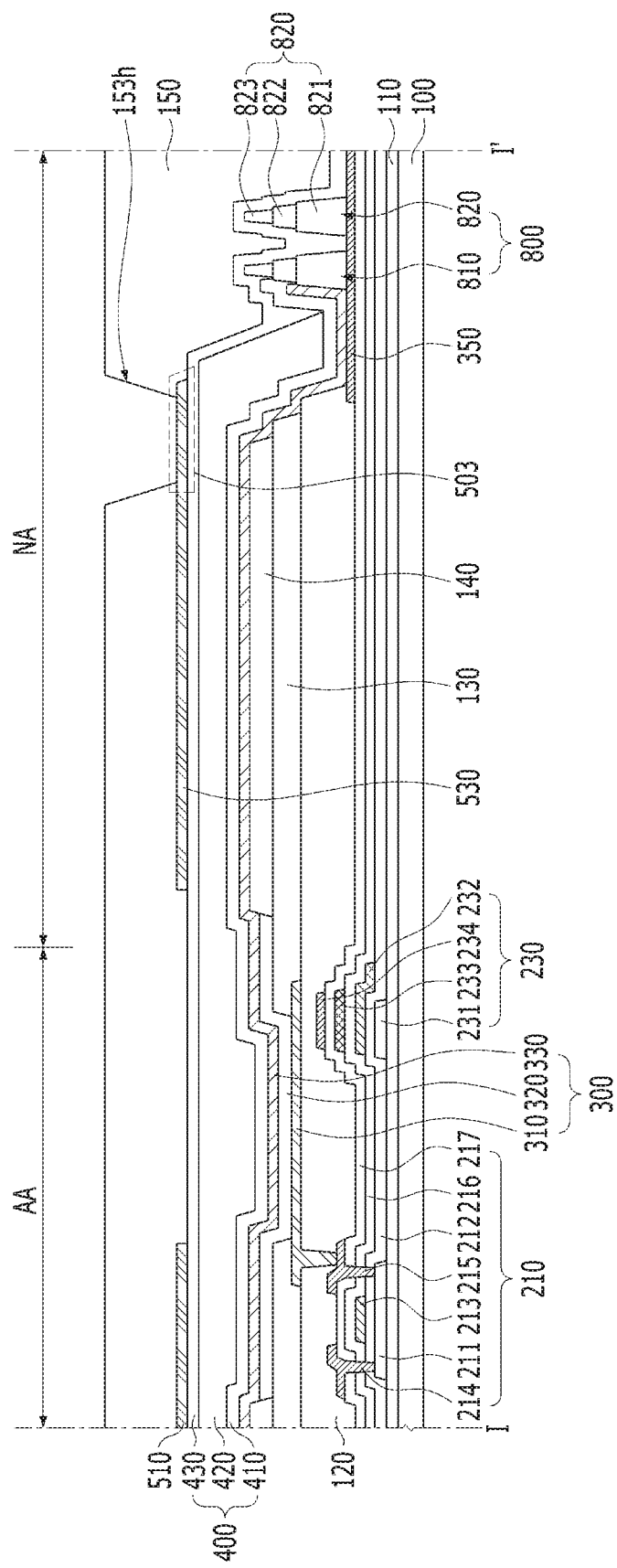
FIGS. 3 to 5 are views respectively showing a display apparatus according to another embodiment of the present invention.

For example, in the display apparatus according to another embodiment of the present invention, the touch passivation layer 150 can include third pad holes 153h exposing a portion of each second touch pad 503, as shown in FIG. 3. Thus, in the display apparatus according to another embodiment of the present invention, the degree of freedom for equipment used in the defect inspection process of the touch electrodes 510 and the first touch lines 520 may be improved. And, in the display apparatus according to another embodiment of the present invention, the touch of the user and/or tool can be detected through the second touch pads 503. Therefore, in the display apparatus according to another embodiment of the present invention, the reliability for the touch of the user and/or tool can be effectively improved.

Figure 4:
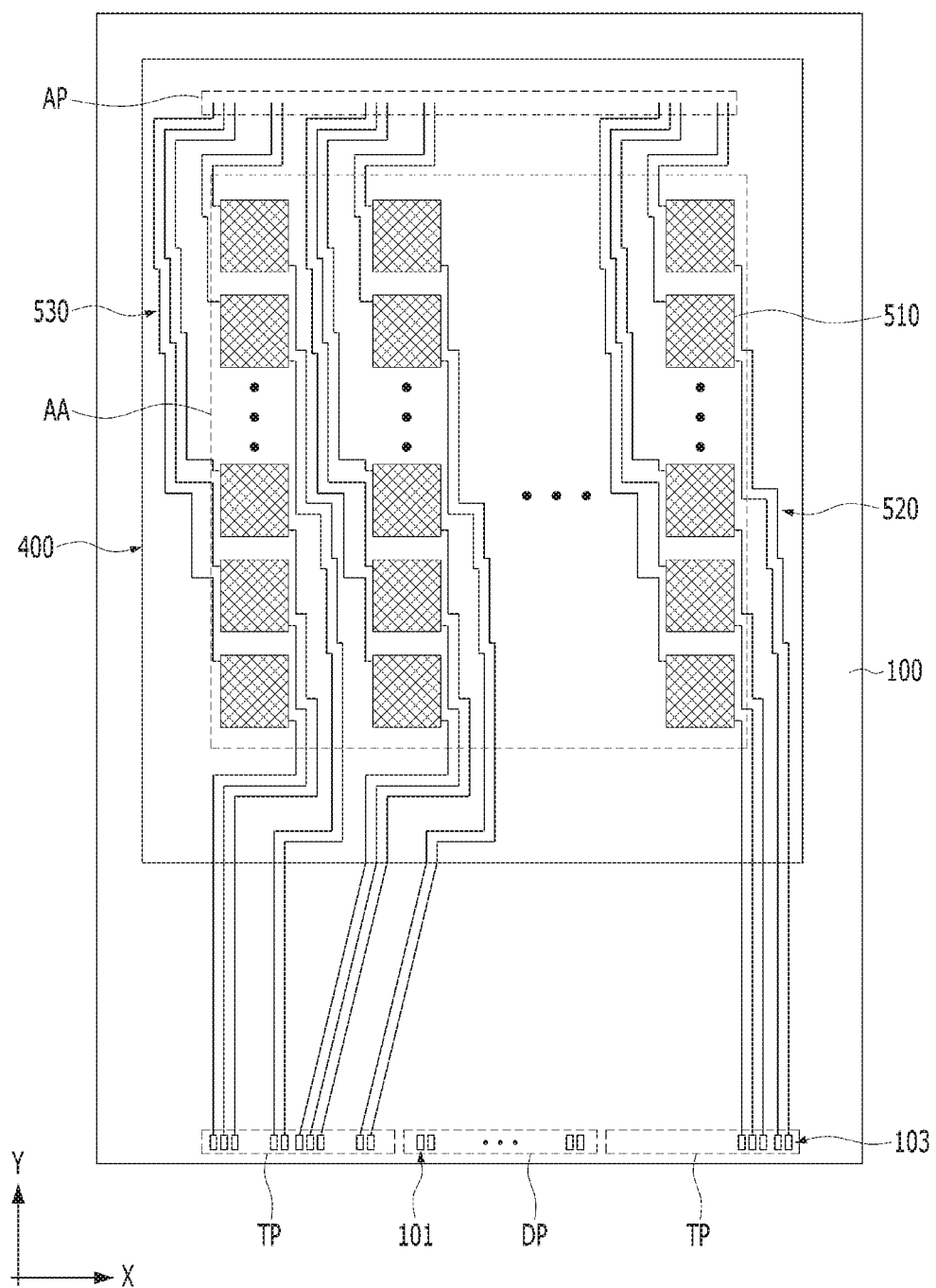

The display apparatus according the embodiment of the present invention is described that the second touch pads 503 can be disposed side by side in the second direction X on the auxiliary area AP. However, the display apparatus according to another embodiment of the present invention may not include the second touch pads 503. For example, in the display apparatus according to another embodiment of the present invention, the second touch pads 503 may be not formed. For example, in the display apparatus according to another embodiment of the present invention, each of the second touch lines 530 can include an end which is disposed in the auxiliary area AP, as shown in FIG. 4. Thus, in the display apparatus according to another embodiment of the present invention, the parasitic capacitance difference due to the location of the touch electrodes 510 can be prevented without changing the inspection process of the touch electrodes 510 and the first touch lines 520. That is, in the display apparatus according to another embodiment of the present invention, the degree of freedom for the test process can be improved.

The display apparatus according to the embodiment of the present invention is described that the second pad area DP in which the display pad 101 is disposed can be disposed side by side with the first pad area TP in the second direction X.

Figure 5:
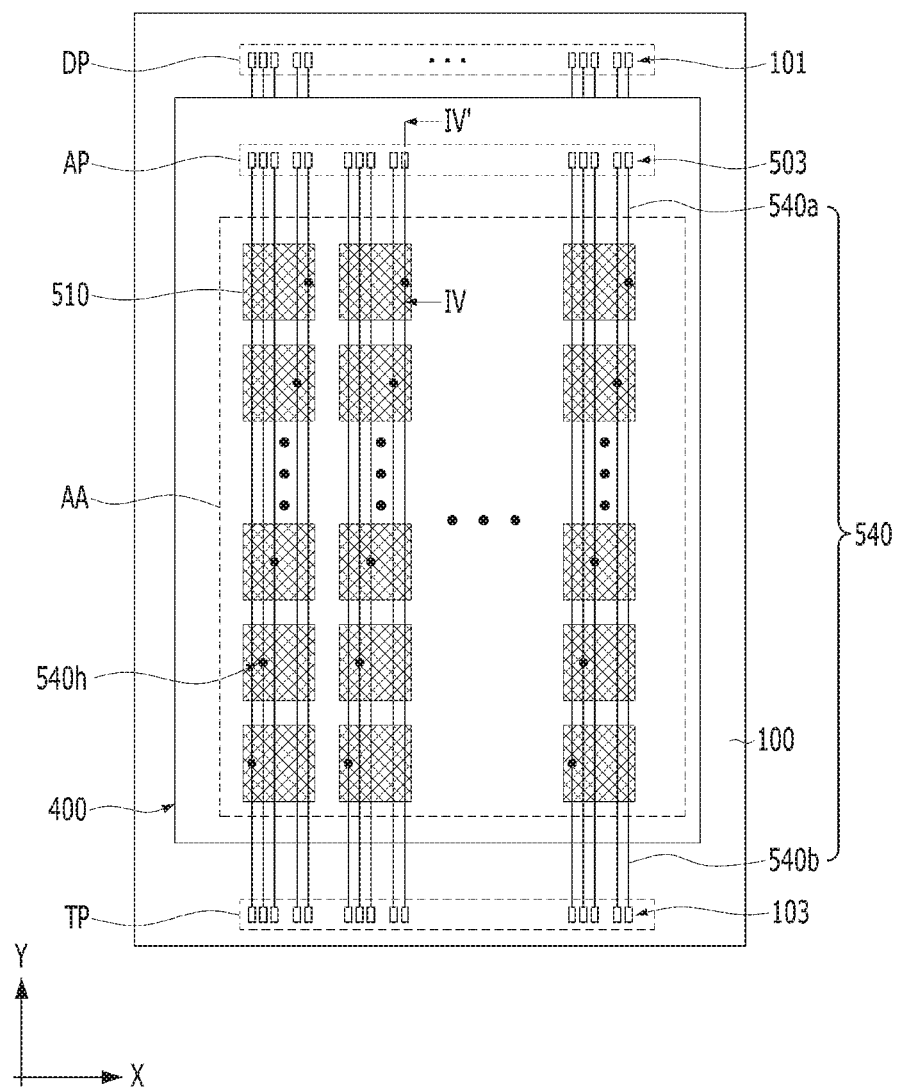
Figure 6:
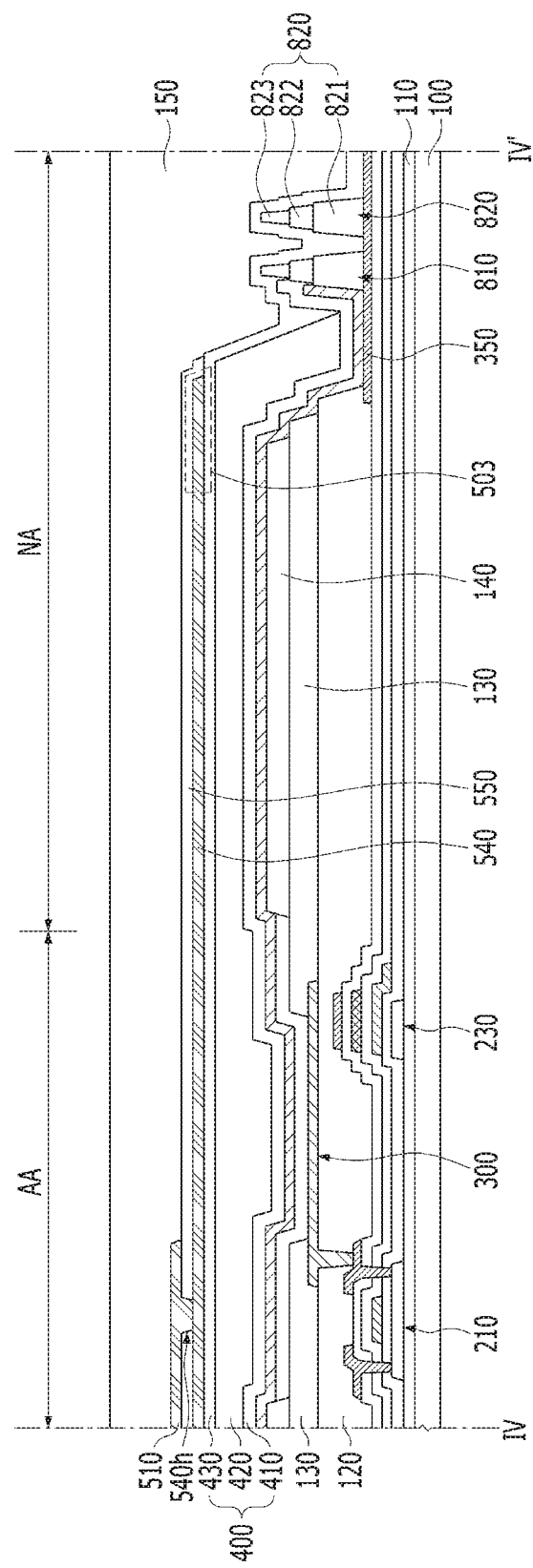
FIG. 6 is a view taken along IV-IV' of FIG. 5.

However, a display apparatus according to another embodiment of the present invention can include display pad 101 which is disposed side by side with the first touch pads 103 in the first direction Y. For example, in the display apparatus according to another embodiment of the present invention, the auxiliary area AP can be disposed between the second pad area DP in which at least one display pad 101 is disposed, and the display area AA in which at least one light-emitting device 300 is disposed, as shown in FIG. 5. FIG. 6 is a view taken along IV-IV' of FIG. 5.

The display pad 101 can be disposed outside the second touch pads 503 in which are disposed in the auxiliary area AP. Thus, in the display apparatus according to another embodiment of the present invention, the degree of freedom for arrangement of the display pad 101, the first touch pads 103 and the second touch pads 503 can be improved.

The display apparatus according to the embodiment of the present invention is described that each of the touch electrodes 510 can be disposed on the same layer as the corresponding first touch line 520 and the corresponding second touch line 530. However, in the display apparatus according to another embodiment of the present invention, the touch electrodes 510 can be disposed on a layer different from the first touch lines 520 and the second touch lines 530. For example, in the display apparatus according to another embodiment of the present invention, the touch electrodes 510 can be disposed on touch insulating layer 550 covering the touch lines 540, as shown in FIGS. 5 and 6. Each of the touch lines 540 can extend in the first direction Y. For example, each of the touch line 540 can cross the touch electrodes 510 which are disposed side by side in the first direction Y. The touch insulating layer 550 can include an insulating material. The touch insulating layer 550 can include touch penetrating holes 540*h* overlapping with each touch electrode 510. Each of the touch electrodes 510 can be connected to the corresponding touch line 540 through one of the touch penetrating holes 540*h*. The touch lines 540 can include a material different from the touch electrodes 510.

Each of the touch lines 540 can connect between the first pad area TP and the auxiliary area AP. For example, each of the first touch pads 103 can be connected to one of the second touch pads 503 by the corresponding touch line 540. Each of the touch lines 540 can be composed of a first touch line 540*b* which connects the corresponding touch electrode 510 to one of the first touch pads 103, and a second touch line 540*a* which connects the corresponding touch electrode 510 to one of the second touch pads 503. Each of the second touch line 540*a* can be in direct contact with the corresponding first touch line 540*b*. For example, each of the second touch line 540*a* can include the same material as the corresponding first touch line 540*b*. Thus, in the display apparatus according to another embodiment of the present invention, the parasitic capacitance of each touch electrode 510 due to the corresponding touch line 540 can have the same value. Thereby, in the display apparatus according to another embodiment of the present invention, the degree of freedom for forming process of the touch lines 540, and the touch sensitivity of the touch electrodes 510 can be improved.

In the result, the display apparatus according to the embodiments of the present invention can include the touch electrodes on the encapsulating element covering the light-emitting device, wherein each of the touch electrodes can be connected to a first touch line and a second touch line which extends in a direction opposite to the first touch line. The first touch line can connect the corresponding touch electrode to one of the first touch pads. The second touch line can include an end which is disposed on the encapsulating element. Thus, in the display apparatus according to the embodiments of the present invention, the parasitic capacitance difference due to the length difference of the first touch lines can be reduced. That is, in the display apparatus according to the embodiments of the present invention, the touch sensitivity difference due to the location of the touch electrodes can be prevented. Therefore, in the display apparatus according to the embodiments of the present invention, the reliability for the touch of the user and/or tool can be improved.

What is claimed is:

1. A display apparatus comprising:
   at least one light-emitting device on a device substrate;
   an encapsulating element on the device substrate, the encapsulating element covering the at least one light-emitting device;
   touch electrodes on the encapsulating element;
   first touch pads on the device substrate, the first touch pads being spaced away from the encapsulating element;
   first touch lines extending in a first direction, each of the touch electrodes being connected to one of the first touch pads by one of the first touch lines; and
   second touch lines extending in the first direction, the second touch lines respectively, connected to the touch electrodes,
   wherein each of the touch electrodes is connected one of the first touch lines and one of the second touch lines, and
   wherein each of the second touch lines extends in a direction opposite to the corresponding first touch line with respect to the corresponding touch electrode.

2. The display apparatus according to claim 1, wherein a sum of a length of the first touch line and a length of the second touch line which are connected to the same touch electrode are constant.

3. The display apparatus according to claim 1, wherein the second touch lines include the same material as the first touch lines.

4. The display apparatus according to claim 3, wherein the first touch lines include the same material as the touch electrodes.

5. The display apparatus according to claim 3, wherein the first touch lines and the second touch lines are disposed on the same layer as the touch electrodes.

6. The display apparatus according to claim 5, wherein each of the first touch lines and each of the second touch lines are in contact with a side surface of the corresponding touch electrode which extends in the first direction.

7. The display apparatus according to claim 1, further comprising at least one display pad on the device substrate,
   wherein the at least one display pad is connected to the at least one light-emitting device, and
   wherein the at least one display pad is disposed side by side with the first touch lines in a second direction perpendicular to the first direction.

8. The display apparatus according to claim 7, wherein the at least one display, pad includes a material different from the first touch lines.

9. The display apparatus according to claim 1, further comprising second touch pads, each of the second touch pads connected to one of the touch electrodes by one of the second touch lines,
   wherein the second touch pads are disposed on the encapsulating element.

10. The display apparatus according to claim 9, wherein the second touch pads include the same material as the second touch lines.

11. The display apparatus according to claim 9, further comprising a touch passivation layer covering the second touch lines and the second touch pads, wherein the touch passivation layer includes touch pad holes exposing a portion of each of the second touch pads.

12. A display apparatus comprising:
a device substrate including a display area between a first pad area and an auxiliary area,
the first pad area, the display area and the auxiliary area being arranged in a first direction;
at least one light-emitting device on the display area of the device substrate;
an encapsulating element covering the at least one light-emitting device, the encapsulating element extending beyond the display area;
touch electrodes on the encapsulating element, the touch electrodes overlapping with the display area;
first touch lines connecting each touch electrode to one of touch pads which are disposed in the first pad area;
second touch lines connected to the touch electrodes, each of the second touch lines including an end in the auxiliary area,
wherein each of the touch electrodes is connected one of the first touch lines and one of the second touch lines,
wherein the first pad area is disposed outside the encapsulating element, and wherein the auxiliary area overlaps the encapsulating element.

13. The display apparatus according to claim 12, wherein the device substrate further includes a second pad area in which at least one display pad connected to the at least one light-emitting device is disposed, and
wherein the second pad area is disposed outside the encapsulating element.

14. The display apparatus according to claim 13, wherein the auxiliary area is disposed between the display area and the second pad area.

15. The display apparatus according to claim 13, wherein the first touch lines include a material different from the touch electrodes.

16. The display apparatus according to claim 15, wherein the second touch lines include the same material as the first touch lines.

17. The display apparatus according to claim 15, wherein the touch electrodes are disposed on a touch insulating layer covering the first touch lines and the second touch lines, and
wherein the touch insulating layer includes touch penetrating holes overlapping with the touch electrodes.

18. The display apparatus according to claim 17, wherein each of the second touch lines is connected to the corresponding first touch line.

19. A display apparatus comprising:
at least one light-emitting device on a device substrate;
an encapsulating element on the device substrate, the encapsulating; element covering the at least one light-emitting device;
touch electrodes on the encapsulating element;
first touch pads on the device substrate, the first touch pads being spaced away from the encapsulating element;
first touch lines extending in a first direction, each of the touch electrodes being connected to one of the first touch pads by one of the first touch lines;
second touch lines extending in the first direction, the second touch lines respectively connected to the touch electrodes,
wherein each of the second touch lines extends in a direction opposite to the corresponding first touch line with respect to the corresponding touch electrode; and
second touch pads, each of the second touch pads being connected to one of the touch electrodes by one of the second touch lines,
wherein the second touch pads are disposed on the encapsulating element.

* * * * *